United States Patent
Gambino et al.

(10) Patent No.: US 9,911,572 B2
(45) Date of Patent: Mar. 6, 2018

(54) METHOD FOR CONTROLLING AN INTERACTION BETWEEN DROPLET TARGETS AND A LASER AND APPARATUS FOR CONDUCTING SAID METHOD

(71) Applicant: ETH Zurich, Zurich (CH)

(72) Inventors: Nadia Gambino, Zurich (CH); Reza Abhari, Forch (CH); Flori Alickaj, Hombrechtikon (CH); Felix Daners, Schaffhausen (CH); Andrea Giovannini, Lugano (CH); Oran Morris, Dublin (IE); Bob Rollinger, Zurich (CH)

(73) Assignee: ETH Zurich (CH)

( * ) Notice: Subject to any disclaimer, the term of this patent is extended or adjusted under 35 U.S.C. 154(b) by 316 days.

(21) Appl. No.: 14/412,819

(22) PCT Filed: Jul. 5, 2013

(86) PCT No.: PCT/EP2013/064288
§ 371 (c)(1),
(2) Date: Jan. 5, 2015

(87) PCT Pub. No.: WO2014/006193
PCT Pub. Date: Jan. 9, 2014

(65) Prior Publication Data
US 2015/0179401 A1    Jun. 25, 2015

(30) Foreign Application Priority Data

Jul. 6, 2012  (EP) ..................... 12005014

(51) Int. Cl.
*H05G 2/00* (2006.01)
*H01J 37/304* (2006.01)
*H01J 37/22* (2006.01)

(52) U.S. Cl.
CPC .......... *H01J 37/3045* (2013.01); *H01J 37/22* (2013.01); *H05G 2/006* (2013.01); *H05G 2/008* (2013.01);
(Continued)

(58) Field of Classification Search
CPC .... H05G 2/003; H05G 2/008; G03F 7/70033; G01N 2015/149
See application file for complete search history.

(56) References Cited

U.S. PATENT DOCUMENTS

| | | |
|---|---|---|
| 6,792,076 B2 | 9/2004 | Petach et al. |
| 7,718,985 B1 | 5/2010 | Bernath et al. |

(Continued)

FOREIGN PATENT DOCUMENTS

WO    2008010710 A2    1/2008

OTHER PUBLICATIONS

Hansson, et al., "Stabilization of liquified-inert-gas jets for laser-plasma generation", J. Appl. Phys., Apr. 15, 2004, pp. 4432-4437, vol. 95, No. 8.

*Primary Examiner* — Thanh Luu
(74) *Attorney, Agent, or Firm* — The Webb Law Firm

(57) ABSTRACT

A method for controlling an interaction between droplet targets and a high power and high-repetition-rate laser beam at a laser focus position of the laser beam including providing a droplet generator for generating a train of droplets as a droplet target with a predetermined droplet frequency and velocity in a predetermined direction; providing a high power, high-repetition-rate laser for emitting a pulsed laser beam, which is focused in the laser focus position; aligning the droplet generator such that the train of droplets runs through the laser focus position; generating a train of droplets as a droplet target; and emitting a pulsed laser beam in synchronization with the train of droplets, such that the (Continued)

droplet target interacts with the pulsed laser beam at the laser focus position.

14 Claims, 6 Drawing Sheets

(52) U.S. Cl.
CPC .......... *H01J 2237/20292* (2013.01); *H01J 2237/24507* (2013.01); *H05G 2/005* (2013.01)

(56) References Cited

U.S. PATENT DOCUMENTS

| | | | |
|---|---|---|---|
| 2005/0112541 A1* | 5/2005 | Durack | C12N 5/0612 |
| | | | 435/2 |
| 2005/0205810 A1 | 9/2005 | Akins et al. | |
| 2010/0294958 A1 | 11/2010 | Hayashi et al. | |
| 2012/0019826 A1 | 1/2012 | Graham et al. | |

* cited by examiner

METHOD FOR CONTROLLING AN INTERACTION BETWEEN DROPLET TARGETS AND A LASER AND APPARATUS FOR CONDUCTING SAID METHOD

CROSS-REFERENCE TO RELATED APPLICATIONS

This application is the United States national phase of International Application No. PCT/EP2013/064288 filed Jul. 5, 2013, and claims priority to European Patent Application No. 12005014.1 filed Jul. 6, 2012, the disclosures of which are hereby incorporated in their entirety by reference.

BACKGROUND OF THE INVENTION

Field of the Invention

The present invention relates to the technology of exposing a train of droplet targets to laser radiation. It refers to a method for controlling an interaction between droplet targets and a high power and high-repetition-rate laser beam.

Description of Related Art

The generation of spatially stable micro-sized droplets has applications in several scientific and industrial fields. These include nuclear physics, where droplet are used as fuel for inertial fusion confinement (ICF) or semiconductor industry, where micro-sized droplets are used as fuel for Soft X rays Laser Produced Plasma (LPP) sources. In particular, the semiconductor industry requires the fabrication of microchips with node sizes below 24 nm. For this purpose next generation photolithography techniques are required, capable of providing radiation emission in the Extreme Ultraviolet (EUV) wavelength region. Current bright EUV radiation sources emit at 13.5 nm in the 2% bandwidth (called in-band radiation). The requirement of 13.5 nm in-band radiation is due the available multilayer mirrors. These mirrors are made from 40-60 alternating layers of molybdenum and silicon and reflect about the 70% of incoming EUV radiation at 13.5 nm. In order to develop an EUV light source, the scientific and industrial communities have devoted their attention to elements such as xenon and tin. If xenon or tin is brought in a state of plasma, the atomic transitions identified in the plasma are the desired ones in order to obtain photon emission in the EUV wavelength region.

Plasma EUV sources are mainly developed using Discharge Produced Plasmas (DPP) when xenon is used as fuel, or Laser Produced Plasma (LPP) when tin is used as the fuel. For the LPP, a laser beam (generally a ND:YAG or a $CO_2$ laser) having a power on the order of kilowatts with pulse lengths on the order of nanoseconds is focused onto solid or liquid tin targets. The liquid tin is generally in the form of micro-sized droplet targets. A laser power density of about $10^{10}$-$10^{11}$ W/cm$^2$ will be delivered to the target, thus generating first the vaporization of the solid material and then the plasma. At these power densities the ions within the plasma have high enough charge states so that emission occurs in the EUV region, in particular at 13.5 nm. The emitted in-band radiation is then reflected by the collector mirror and directed towards the so-called intermediate focus (IF) point. In a typical scanner, a number of illumination optics directs the EUV light from the IF to the reticle (or mask), before it is projected onto the wafer.

The principal requirements for the LPP source include the use of mass limited liquid tin droplet targets. The advantage of using droplet targets is that they can ensure long-term operation of the source as they form a regenerative target material, capable of operating at high repetition rates. At the same time, the use of mass limited targets reduces the emission of high-energy plasma particles (such as ions or neutrals) that damage the EUV radiation collection optics. On the other hand, many physical and chemical processes have to be taken into account when mass limited droplet target are generated. During source operation, the droplet target can be affected by spatial and temporal instabilities. Mainly two types of instabilities are distinguished: lateral instabilities, i.e. spatial position drifts perpendicular to the droplet train, and axial instabilities, i.e. spatial position drifts along the droplet train. Lateral instabilities imply variations of the deposited laser energy on the droplet target, as the droplet target position drifts in the plane of the incoming laser. Axial instabilities imply variations of the droplet spacing and lead to temporal jitters, as the droplets do not pass the laser focus at a constant frequency. This leads to droplet/laser pulse de-synchronization.

As a consequence, both types of instabilities induce variations in the EUV emission. Therefore, a key requirement for an EUV source is to deliver droplets to the irradiation site with maximum stability. Since the causes of these instabilities are not always well known, it is fundamental to develop high precision control systems capable of maintaining the droplet target position at the high power laser focus position with a specific frequency. The controller needs to compensate for spatial and temporal instabilities. Control systems can have a closed loop or and open loop. An open loop control system simply consists of the synchronization of the electrical signals controlling the droplet target and the laser pulse. A closed loop control system is able to return the droplet to the main laser focus position if a lateral instability occurs. It is clear that a closed loop control system is preferable for the correct operation of the EUV source. The position of the droplet target needs to be adjusted in a micrometer scale range and frequently in time. That means that the spatial resolution and response time of the controller needs to be as high as possible. Different system can be built for controlling the target position, employing different types of sensors. Previous control systems were developed with the use of CCD sensors, photodiode sensors etc. However, previous system employed a combination of numerous types of sensors, in order to achieve high precision for the controller in both spatial and temporal domain.

SUMMARY OF THE INVENTION

It is an object of the invention, to provide an improved method for precisely controlling the interaction between droplet targets and the laser beam.

It is another object of the invention to have an improved apparatus for conducting such interaction.

The method according to the invention comprises the steps of a) providing a droplet generator for generating a train of droplets as a droplet target with a predetermined droplet frequency and velocity in a predetermined direction;

b) providing a high power, high-repetition-rate laser for emitting a pulsed laser beam, which is focused in said laser focus position;

c) aligning said droplet generator such that said train of droplets runs through said laser focus position;

d) generating a train of droplets as droplet target; and e) emitting a pulsed laser beam in synchronization with said train of droplets of said droplet target, such that said droplet target interacts with said pulsed laser beam at said laser focus position; whereby f) the actual position of individual droplets of said droplet target is measured in a plane crossing, preferably perpendicular to, the direction of said droplet target;

g) the velocity of individual droplets of said droplet target is measured;

h) the droplet generator is realigned in a feedback mode, when the measured actual position of said individual droplets deviates from a predefined set position; and i) the timing of the pulses of the pulsed laser beam is changed in a feedback mode, when the measured velocity of said individual droplets leads to an arrival time of the respective droplets at said laser focus position, which is out of synchronization with the pulsed laser beam.

According to an embodiment of the invention said actual position and said velocity of individual droplets of said droplet target is measured optically.

Specifically, the droplets to be measured are illuminated on their way from the droplet generator to the laser focus position by at least two fixed laser beams crossing the droplet target in the form of laser lines extending perpendicular to the beam direction and the direction of said droplet target, and the position of said droplets of said droplet target within said laser lines is determined by position sensitive photo detection means, preferably linear photodiode arrays, which are illuminated by said laser beams after having crossed said droplet target.

More specifically, said at least two laser beams illuminate said droplet target from two different directions in a plane perpendicular to the droplet target and at two different heights with respect to the direction of said droplet target.

Even more specifically, the time delay is measured between the subsequent illuminations of an individual droplet of said droplet target by said at least two laser beams, and the velocity of said individual droplet is determined from said measured time delay and the distance between said at least two laser beams in the direction of the droplet target.

Even more specifically, said at least two laser beams are each split into a first and second beam after having crossed said droplet target, and said subsequent illuminations of an individual droplet of said droplet target by said at least two laser beams are sensed by separate single channel photodiodes, each receiving a second of said split beams.

According to another embodiment of the invention the droplet generator is realigned by moving said droplet generator in a plane crossing, preferably perpendicular to, the droplet target and/or tilting said droplet generator.

According to another embodiment of the invention the interaction between the droplet target and the pulsed laser beam generates EUV radiation, the EUV radiation is sensed by a radiation sensor, and the signal of the radiation sensor is used to determine the laser focus position.

An Extreme Ultraviolet (EUV) radiation sensor or any other sensor sensitive in the Ultraviolet to Soft X ray wavelength region may be used for that purpose.

According to a further embodiment of the invention the position and velocity measuring steps (f) and (g) are repeated a predetermined number of times and the results stored in order to determine the droplet target position with enhanced precision.

The apparatus according to the invention comprises: a movable droplet generator, which ejects a train of droplet targets in a predetermined direction, a controllable high-repetition-rate, high power laser, which emits a pulsed laser beam being focused in a laser focus position lying on the way of said train of droplets, a first continuous laser emitting a first continuous laser beam in a first plane crossing the droplet target in a first direction, a second continuous laser emitting a second continuous laser beam in a second plane crossing the droplet target in a second direction, first means for expanding said first continuous laser beam into a first laser line extending perpendicular to the droplet target and crossing said droplet target, second means for expanding said second continuous laser beam into a second laser line extending perpendicular to the droplet target and crossing said droplet target, first photodetection means for receiving said first laser line after having crossed said droplet target, second photodetection means for receiving said second laser line after having crossed said droplet target, and a control unit, which receives signals from said first and second photodetection means and controls the movement of said droplet generator and the timing of the laser pulses of said high-repetition-rate, high power laser.

According to an embodiment of the invention said first and second plane are separated in the direction of said droplet target by a first distance.

According to another embodiment of the invention said first and second directions are orthogonal to each other.

According to just another embodiment of the invention said first and second expanding means comprises a beam expander and a cylindrical lens each.

According to a further embodiment of the invention said first and second photodetection means are a multichannel photodiode sensor or linear photodiode array each.

Specifically, a magnifying lens is arranged before each of said multichannel photodiode sensors or linear photodiode arrays.

Specifically, a band-pass optical or spectral filter is arranged at the entrance of each of said multichannel photodiode sensors or linear photodiode arrays.

According to another embodiment of the invention first and second beam splitting means are provided in said first and second laser lines behind said laser focus position in order to generate a first and second split beam, and third and fourth photodetection means are provided to receive said first and second split beams and send respective signals to said control unit.

Specifically, said third and fourth photodetection means are single channel photodiodes each.

According to another embodiment of the invention a radiation sensor is provided to receive EUV radiation generated at said laser focus position and send respective signals to said control unit.

According to another embodiment of the invention said movable droplet generator is mechanically coupled to a motor, which is controlled through said control unit by means of a motor controller.

BRIEF DESCRIPTION OF THE DRAWINGS

The present invention is now to be explained more closely by means of different embodiments and with reference to the attached drawings.

DETAILED DESCRIPTION OF THE INVENTION

Figure 1:
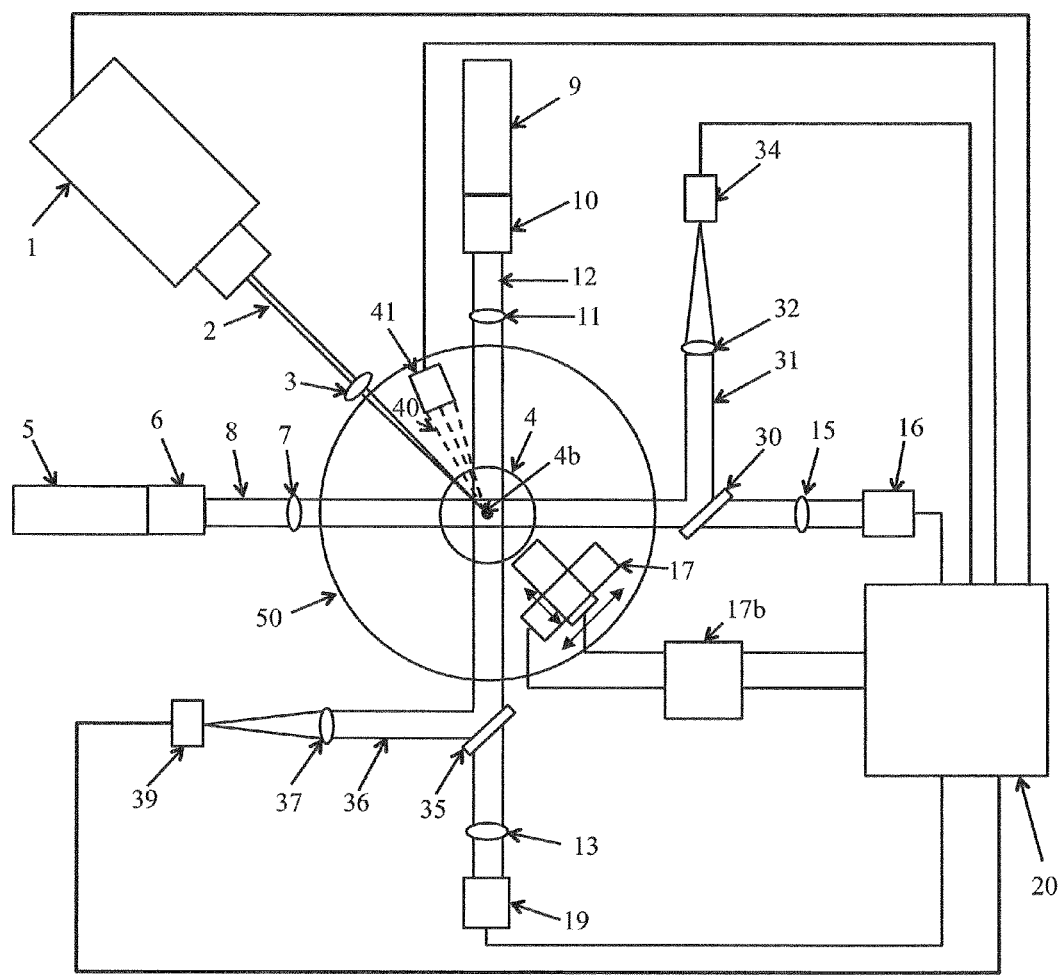
FIG. 1 shows general aspects of the embodiment of the present invention schematically.

The present invention proposes in an embodiment a system that employs only a limited number of photodiodes sensors and a limited number of laser beams. Two multi channel photodiodes arrays track the droplet target position in the plane of the laser beam and along the droplet train. Two laser are employed to illuminates all photodiodes. With this system one is able to actively track and control the droplet target position during source operation, both in the spatial and in the temporal domain. The system is able to provide high response time and high spatial resolution.

The present invention provides a method for the detection, tracking and automated positioning of the droplet targets at a set position. In particular, it provides a method for the positioning of droplet targets employed e.g. as fuel in EUV-LPP sources.

The droplet target is generated through a motorized delivery system, e.g. the droplet target dispenser or droplet generator. A high power laser is focused on the droplet target, generating the plasma. In an embodiment, the plasma emits radiation in EUV wavelength region.

The positioning and triggering system consists of a detection and tracking system for the droplet target position. The system also includes a feedback system that provides logics in order to actively compensate for lateral and axial instabilities of the droplet target and to avoid de-synchronization between the high power laser and the droplet target in the spatial and in the temporal domain.

The tracking system consists of at least two laser beams, created with two continuous low power lasers (could be also only one laser) and of at least two photosensitive sensors. A combination of optical lenses is aligned to two lasers in order to obtain two horizontal laser lines. The two laser lines illuminate the droplet target from two different directions on the horizontal plane and on two different heights on the vertical plane. After crossing the droplet target, the two laser lines illuminate the two arrays of photodiodes. Once the droplet target crosses the laser lines, a variation in the current signal on the photodiode sensors will be recorded. The combination of the two photodiodes arrays with the two laser lines is used to actively track the position of the droplet target in the horizontal plane and in the vertical plane. By read-out the current signals in parallelized mode, i.e. all at the same time, the single photodiode composing the two photodiode arrays, can be used to actively control the position of the droplet target also in the temporal domain. If signal read out is done in serialized mode, after illuminating the droplet train both laser lines are sent to two beam splitters. The beam splitters divide each laser line into two laser lines. Four laser lines in total are obtained. Two of these laser lines illuminate the two linear arrays of photodiodes. The other two laser lines are focused on single channel photodiodes. The two single channel photodiode sensors will then actively control the droplet position in the vertical axis. An EUV sensor actively determines the EUV emission from the plasma during source operation. The same sensor or other sensors can actively determine radiation emission from the plasma in other wavelength regions close to the EUV wavelength region such as in the UV or Soft X ray wavelength region.

The current signals obtained from the photosensitive sensors and from the EUV sensor or any other sensor sensitive in the Ultraviolet to Soft X ray wavelength region are sent to a feedback system. The current signals obtained from the two photodiodes arrays are processed in order to determine the spatial position of the droplet target. The current signals obtained from the two single channel photodiodes are used to determine the droplets frequency, i.e. the spacing between the droplets and the velocity of sudden droplets.

The EUV signal, or the signal from any other sensor sensitive in the Ultraviolet to Soft X ray wavelength region, is used to determine the set position for the controller, i.e. the high power laser focus position. The feedback control loop actively controls and eventually corrects the droplet target position if a lateral instability occurs. The controller will give an electronic command to the motorized droplet dispenser stage in order to bring back the droplet target position to the set position. The controller actively controls also the droplet velocity. It sends a trigger pulse to the main laser, at the same frequency or at a multiple frequency of that the droplets are generated at. If a temporal jitter occurs, i.e. if the droplet target velocity changes, the controller is able to change the delay of high power laser trigger signal in order to match laser frequency to the new droplet frequency. This will allow to hit each droplet from the droplet target with the high power laser and to avoid droplet/laser pulse de-synchronization.

The overall system controls laterals and axial instabilities with a spatial resolution of micrometers and a response time of milliseconds.

The following discussion of the embodiments of the present invention directed to an EUV radiation source employing a steering system is exemplary in nature. The invention is not limited to the specified application.

FIG. 1 is an overview of the EUV light source including an overview of the droplet target steering system proposed by the applicants of the present invention. The EUV light source system includes a high power and high-repetition-rate laser 1 delivering a pulsed laser beam 2. The laser beam is focused through a converging lens 3 on a liquid, such as tin, which flows through a liquid tin dispenser or droplet generator 4. A heater will bring the tin material from the solid state to the liquid state. The dispenser comprises in general a micro sized nozzle used as orifice for the liquid tin flow. A piezoelectric transducer eventually located on the nozzle will perturb the tin flow in order to generate the droplet target 4b, i.e. a train of droplets with a desired frequency. The generated droplets have a predetermined spacing, size and velocity for the EUV radiation generation process. The entire droplet dispenser or generator 4 is placed in vacuum chamber 50 so that droplets are created in vacuum or at low levels of background pressure. The droplet generator 4 is not described in detail since its specifics are well known in the art and are not directly related to the embodiment of the present invention. It can be represented with any droplet generator suitable for the purposes described in the present invention.

The droplet target position can be adjusted by moving the droplet dispenser 4 to a desired spatial position in the horizontal and vertical plane, i.e. the plane perpendicular and parallel to the droplet target 4b. It will be understood that this position corresponds to the main laser focus position and has to be known with a micrometer spatial resolution. It is hence preferable to drive the droplet dispenser with two motors 17 comprising two horizontal axes of motion and a motor controller 17b. The motors further comprise a tilting system able to tilt the droplet dispenser around a rotational axis which fulcrum corresponds to the nozzle orifice exit. The droplet train is orthogonal to the main laser beam direction. The interaction between the main laser beam and the droplet target will produce the plasma. The plasma is a bright source of light. Radiation will be emitted in a wide range of wavelengths. If the laser power density is $10^{10}$-$10^{12}$ W/cm$^2$, plasma radiation will be emitted also in the EUV wavelength region. The EUV radiation 40 can be recorded with an EUV light sensor 41 in the form of a current signal. The same sensor 41 or other sensors can actively determine radiation emission from the plasma in other wavelength regions close to the EUV wavelength region such as in the UV or Soft X ray wavelength region. Also the radiation sensor 41 is not described in detail since its specifics are known in the art and are not directly related to the embodiment of the present invention.

To detect the droplet target in the spatial and temporal domain during source operation the active tracking system is made primarily of two initial low power laser beams created by two lasers 5 and 9 working in continuous mode. The system further comprises two multiple channel photodiodes consisting of two linear photodiode arrays 16 and 19. With use of two beam expanders 6 and 10 and different type of lenses 7, 11, 13 and 15, two horizontal laser lines 8 and 12 are created.

In the preferred embodiment of the present invention the two laser lines 8 and 12 cross the droplet target from two different directions on the horizontal plane, which may be orthogonal to each other, and at two different heights in the direction of the droplet target 4b or droplet train. The laser lines cross first the droplet target 4b. The laser lines 8 and 12 will be sent to the two photodiode arrays 16 and 19. The photodiode arrays 16, 19 record the signal coming from the laser lines 8 and 12.

When the droplet target 4b crosses the laser lines a variation in the current signal intensity and waveform will be recorded from the photodiodes. The current signals coming from the two photodiodes arrays are read-out in parallelized mode. The photodiode signals are used to calculate the droplet target position in the horizontal and vertical plane and to monitor this position actively during source operation. Parallelized read-out of the signals (all signals read out at the same time) will allow using the current signals coming from the single photodiodes composing the photodiode array to calculate the droplet target velocity and to monitor the spacing of the droplets along the droplet target during source operation. If the photodiode signals are read-out in serialized mode, the laser lines illuminate also two beam splitters 30 and 35. The two beam splitters split each laser line into two laser lines so that four laser lines in total are obtained. Part of the laser lines change direction in the horizontal plane and are sent to the two single channel photodiodes 34 and 39. The current signals recorded from the two single channel photodiode are then used to calculate the droplet target velocity.

A control unit 20 stores and processes the current signals of the photodiodes and of the EUV sensor 41 or any other sensor sensitive in the Ultraviolet to Soft X ray wavelength region. The current signal coming from sensor 41 is used to calculate the focus position 2b, i.e. the set position for the control unit 20. If a lateral instability occurs, the control unit 20 will give a command to the motor controllers 17b in order to bring back the droplet target 4b to the set position. The control unit 20 will also actively monitor the droplet target velocity and trigger the main laser frequency of laser 1 with the droplet train frequency. If an axial instability occurs the control unit 20 will send the trigger signal for the high power laser 1 according to the new droplet train frequency.

Figure 2:
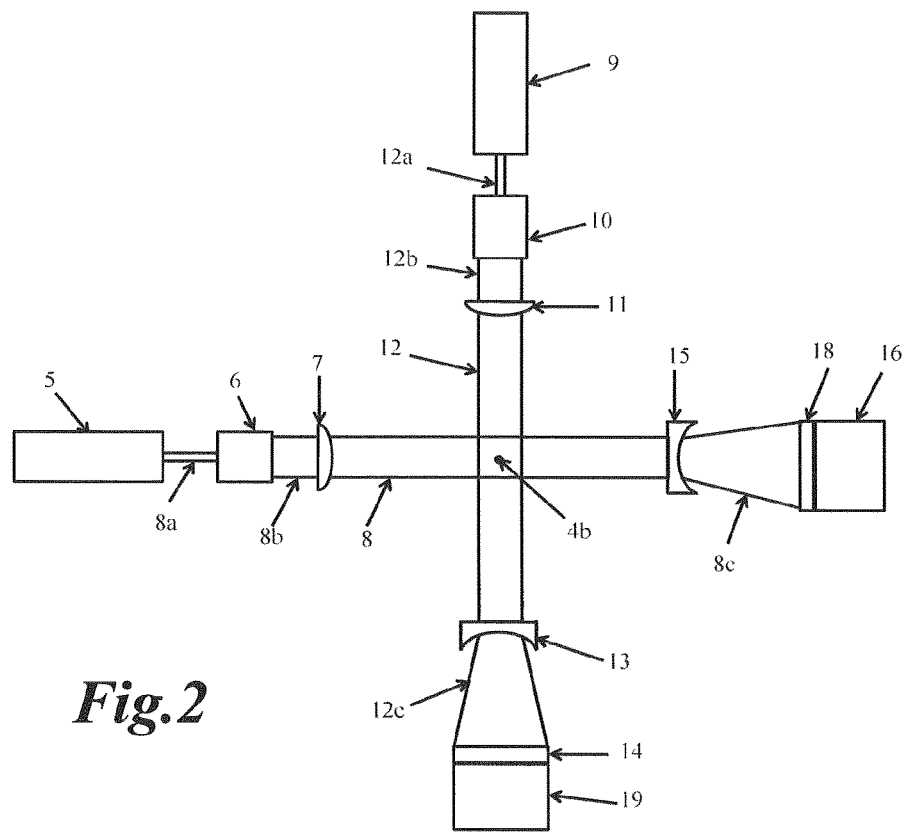
FIG. 2 shows some aspects of the embodiment of the present invention illustrated in FIG. 1.

The tracking system for the determination of the droplet target position in the horizontal plane and vertical is shown in detail in FIG. 2. A top view of the two laser beams shows how the laser lines 8 and 12 are created and how they illuminate first the droplet target 4b and thereafter the sensors or linear photodiode arrays 16 and 19. The two lasers 5 and 9 are, for example, two HeNe lasers or any other type of continuous emitting lasers operating at few mW of power. In the preferred embodiment of the present invention, the laser beams 8a and 12a are created with two different laser units having a different wavelength emission in the visible region. This will allow to better discriminating the different laser current signals at the different photosensitive sensors. The beam expanders 6 and 10 increase the diameter of the two laser beams. The beam expander can be built with a combination of optical lenses, using for example the Galilean method.

Figure 3:
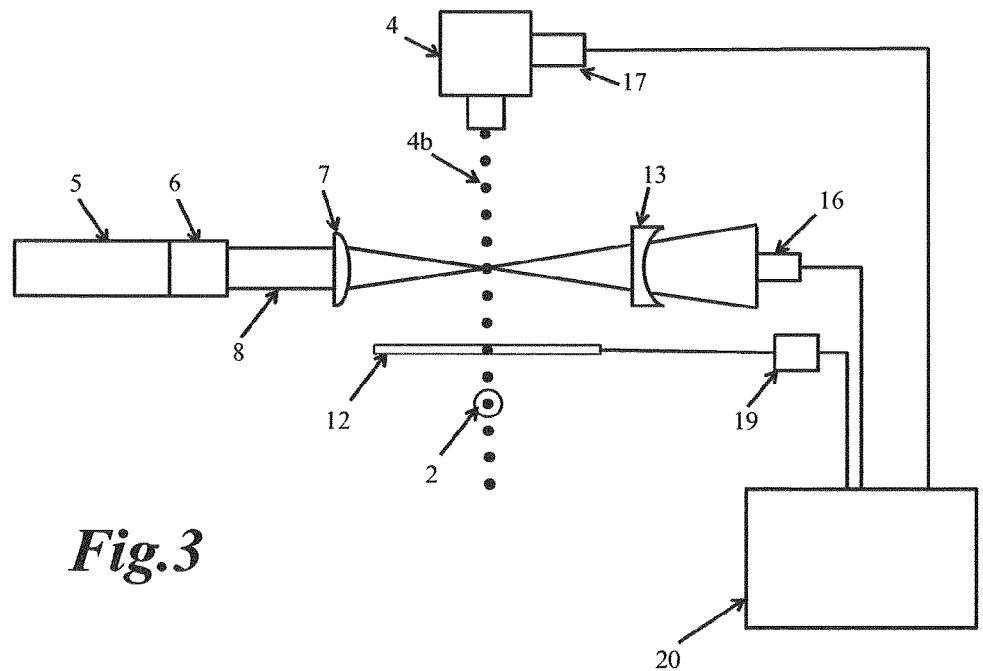
FIG. 3 shows a section view of further details of the schematic illustrations of aspects of the embodiment of the present invention illustrated in FIG. 1 and FIG. 2.

In the preferred embodiment for the present invention the beam expanders 6 and 10 are directly C-mounted to the head of the lasers (as shown in FIG. 1). This set-up allows avoiding dispersion of laser beam light and optical misalignments between the laser units and the beam expanders 6 and 10. The two expanded beams 8b and 12b are then sent respectively to two cylindrical lenses 7 and 11. These lenses focus the beams 8b and 12b only in one direction, i.e. in the vertical plane, at the droplet target position. In this way two horizontal laser lines 8 and 12 are obtained. In the preferred embodiment of the present invention, each laser line is about 10 mm wide in the horizontal plane and has a thickness of some tens of microns in the vertical plane. In FIG. 3 a section view of the laser lines is shown. Assuming that they are located orthogonal to each other in the horizontal plane in order to increase the precision on the determination of the droplet target position, the droplet target 4b crosses the laser line 12 (but also the laser line 8) at any point within its horizontal extension. On the vertical plane the laser line 8 (but also the laser line 12) is focused on the droplet target.

Theoretically, the best distance between the laser lines in the vertical plane should not exceed the distance between two droplets composing the droplet target 4b. Since the distance between two droplets composing the droplet train can be very small (on the order of tens of microns), generally a distance between the laser lines 8 and 12 of about few hundred of micrometer is set. By processing the signals coming from the single photodiodes composing the photodiode arrays or the signals coming from the single channel photodiodes 34 and 39, the velocity of the droplet train can be calculated, as it will be understood further.

The main laser beam 2 will hit the droplet target 4b below the two laser lines. The distance between the two laser lines 8 and 12 and the plasma ignition position in the vertical should be as small as possible in order to calculate the droplet target position and velocity close to the plasma ignition site.

Going back now to FIG. 2, after crossing the droplet target 4b, the laser lines will be magnified in the horizontal plane by two optical lenses 13 and 15. These lenses can be two concave lenses, or a system of lenses, depending on the desired magnification. At this stage each laser line 8, 12 will change its dimension in the vertical axis (as shown for the laser line 8 in FIG. 3) and in the horizontal axis (as shown in FIG. 2). The magnification of the laser lines obtained with the lenses 13 and 15 allows increasing the spatial resolution of the linear photodiode arrays 16 and 19. This means that the position of the droplet target 4b can be calculated with higher accuracy, even if the gap (the so-called pitch) between two photodiodes composing the photodiode array is on the order of one millimeter.

In front of the detectors 16 and 19 two narrow band pass optical filters 14 and 18 are aligned, as shown in FIG. 2. The filters 14 and 18 will let pass only the light having respectively the wavelength of the two lasers 5 and 9 and block or attenuate as much as possible any radiation having a different wavelength. This will avoid collecting light coming from other sources, as, for example, from the plasma or from the high power laser 1. As shown for the sensor 16 in FIG. 4, the detector 16 constantly records the current signal having a defined intensity and waveform over its photodiode channels. The photodiode arrays 16, 19 need to be coupled to a high bandwidth amplifier board. The amplifier board reads out the current signals of the photodiodes composing the photodiode array in parallelized or serialized mode.

For serialized signal read-out, the sensors 16 and 19 need to have a limited number of diodes in order to ensure high sampling rate of the sensors signals. The droplet trace signal is then obtained from any of the single photodiode current signals composing the array where the droplet target crosses the sensors (or from the single channel photodiode 34 and 39 if serialized red-out signal is chosen). It is clear that parallelized read-out of the signals is preferred. In this way by using only two photodiode arrays it is possible to detect, track and correct the droplet target position in both spatial and temporal domain.

Once the droplet target 4b crosses the laser line, it changes the power density in the laser line and creates a diffraction pattern.

Figure 4:
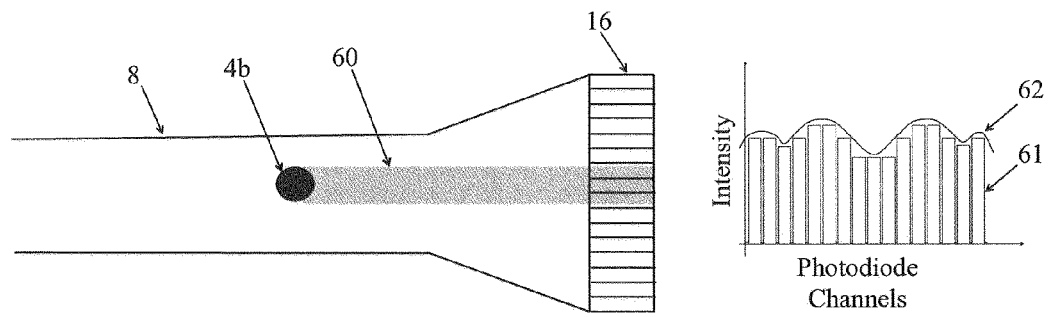
FIG. 4 shows further details of the schematic illustrations of aspects of the embodiment of the present invention illustrated in FIG. 1, FIG. 2 and FIG. 3.

As shown in FIG. 4, the droplets flickers the laser line creating a shadow 60 on it. The periodic current signals 61 on a predetermined number of photodiodes channels will depend from the magnified droplet size and from the diffraction pattern, having a waveform 62, created by the droplet target once it crosses the laser line. The droplet target actual position is directly correlated with the part of the current signal on a determined number of photodiode channels where the largest current intensity decrease is detected. This is the so-called centroid position calculated as the weighted mean of the different current signals amplitudes, including both signal intensity decreases and increases. Diffraction effects can anyway be a source of error in the calculation of the centroid position. To reduce this error, the array can be rotated of a certain angle in the vertical axis so that the single destructive or constructive interference pattern will cross at a certain angle more than one photodiode. The sampling time of the photodiodes will be short enough to record a sufficient number of current signals in order to determine the droplet target position with a high precision. In particular, the variance of the current signals of each single photodiode in the photodiode array will be calculated by using a moving variance filter. From the variance values the center of mass, i.e. the centroid position will then be calculated. If the droplet target will drift in the horizontal plane, the shadow 60, the diffraction pattern and the waveform 62, will shift over different photodiodes channels. This means that the center of mass value will change so that lateral instabilities can be actively detected in time.

Also a cross correlation method can be used to calculate the droplet position using only the change of the waveform 62 once the droplet target position drifts. Other small particles can intercept the laser line during source operation. They are a source of noise in the current signal and in the determination of the droplet target position. However, current signal drops related to small particles crossing the laser line are much smaller in intensity and cross the sensors less frequently with respect to the droplet target. The calculation of the variance and of center of mass will minimize the influence of these particles on the current signal amplitudes.

Figure 5:
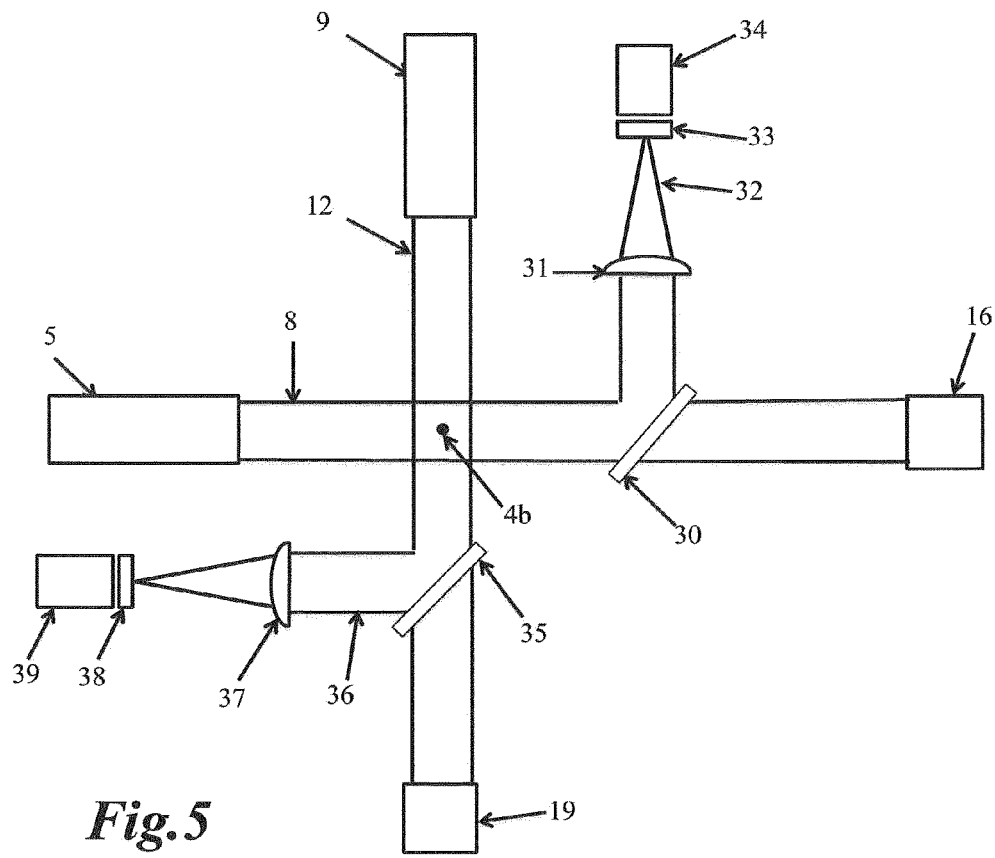
FIG. 5 shows further details of the schematic illustrations of aspects of the embodiment of the present invention illustrated in FIG. 1.
Figure 6:
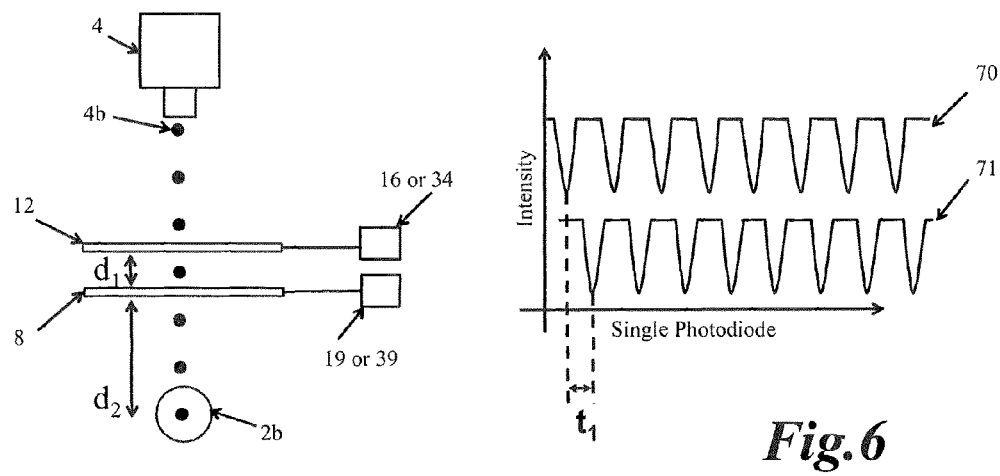
FIG. 6 shows further details of the schematic illustrations of aspects of the embodiment of the present invention illustrated in FIG. 5.

The droplet target 4b is monitored along the vertical direction with the system shown in detail in FIG. 5 and FIG. 6. If parallelized read out of the photodiode signal is used, the single photodiode signals composing the photodiode array where the centroid position of the droplet target is located are used to record the droplet trace.

If serialized read-out of the signal is chosen, the two single channel photodiodes 34 and 39 are used to record the droplet trace. In this case the two beam splitters 30 and 35 send part of the laser lines to two diaphragms (or two focusing lenses) 31 and 36. The two laser lines are reduced to two beams 32 and 37. The beams are sent to two optical filters 33 and 38. These optical filters have the same function of the optical filters 14 and 18.

The single photodiodes composing the array or the single channel photodiodes will record the current signals of the laser beams at a frequency that is higher than the frequency of the droplet train. Once the single droplet crosses the laser line, the decrease of the laser power will be recorded as a change of the current signal. The form of the current signal structure is shown in detail FIG. 6. The current signals recorded by the single photodiodes are indicated with 70 and 71. The vertical distance between the two laser lines 8 and 12 is indicated with $d_1$. Each single droplet will be first detected on the single photodiodes composing the array 16 or on the single channel photodiode 34 and after a certain time delay, indicated with $t_1$, on the single photodiodes composing the array 19 or on the single channel photodiode 39. Since $d_1$ is known and $t_1$ can be calculated, the ratio between $d_1$ and $t_1$ will permit to calculate the velocity of each droplet composing the droplet target.

Once this velocity is known, it is possible to determine the exact time $t_2$ needed from each single droplet in order to reach the high power laser focus position 2b. This focus position is at a fixed vertical distance $d_2$ from the laser line 12. The ratio between $d_2$ and the previous calculated velocity will permit to calculate the time delay $t_2$. This time $t_2$ is used to calculate the delay for the high power laser trigger signal in order to match the laser frequency to the droplet frequency and to hit every droplet. If the spacing between two droplets changes, the velocity v will change so that axial instabilities can be detected over time.

If constant droplet velocity is assumed for each droplet (no drag in vacuum, low gravitational acceleration), only one single constant needs to be determined to calculate the time $t_2$. This constant, which we call c, is the ratio between $d_1/d_2$. This constant multiplies the time $t_1$ in order to obtain the time $t_2$. In formulas since $v=d_1/t_1=d_2/t_2$ and $c=d_1/d_2$, $t_2=c*t_1$. The constant c can be obtained by exactly measuring the distances $d_1$ and $d_2$. Another method to determine c is obtained by placing a third single photodiode and a third (HeNe) laser at the plasma ignition point (with a similar set-up used for the single photodiodes). By measuring the droplet timing at the plasma ignition point, the constant c is varied, until the high power laser trigger signal temporally matches (with a minimized error) the droplet timing signal.

Figure 7:
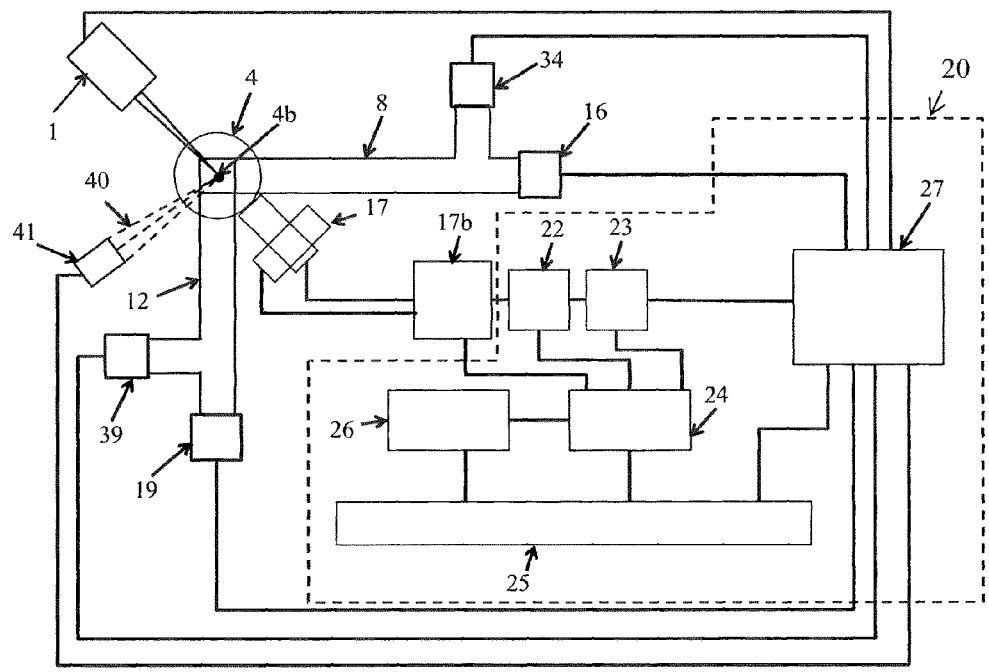
FIG. 7 shows further details of the schematic illustrations of aspects of the embodiment of the present invention illustrated in FIG. 1.

In order to compensate for lateral and axial instabilities the control unit 20 needs to process the sensors signals. The control unit 20 is shown in detail in FIG. 7. An acquisition system 27 continuously records the current signals coming from all photodiodes and from the radiation sensor 41. An analyzing system 23 analyzes the current signals and calculates the droplet position and the droplet velocity. The algorithm is implemented so that the current signals obtained on the sensors, when no droplets cross the laser lines, are taken as background signals. This background signal will be normalized to the current signals obtained once the droplets cross the laser lines. A storage unit 26 stores the droplet target position and the droplet target velocity. A feedback system 22 is used to continuously check if the droplet position corresponds to the set position. If a lateral instability occurs, the feedback system 22 gives an electronically command to the motor controller 17b which in turn will give an electronic command to motors 17 in order to mechanically bring back the droplet target 4b to the set position with a translation or rotational movement of the droplet dispenser 4. From the stored droplet velocity the feedback system 22 can set the time delay $t_2$ for the TTL pulse of the high power laser. If the droplet velocity changes, the control system will alter the TTL signal. The trigger signal will be set with a new delay time $t_2$ to match the high power laser frequency to the actual droplet frequency and will compensate for axial instabilities.

Figure 8:
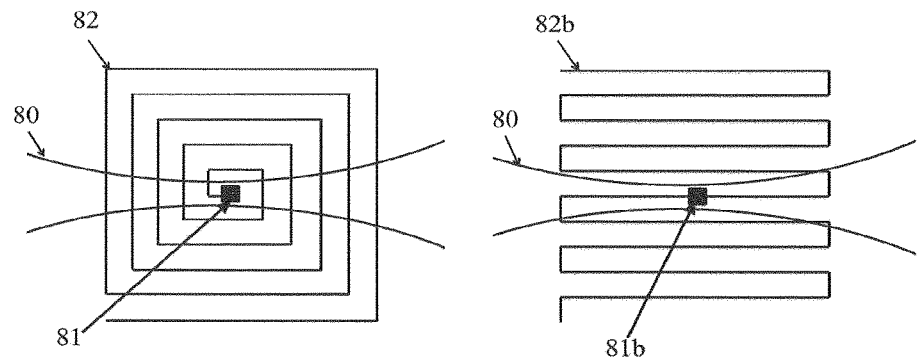
FIG. 8 shows further details of the schematic illustrations of aspects of the embodiment of the present invention illustrated in FIG. 7.

To determine the focus position, i.e. the set position for the controller once the source starts to run, the controller is implemented with an EUV or UV to Soft X rage radiation scan function described in FIG. 8. The radiation current signal is recorded for a predefined droplet target start position 81 or 81b. This start position will be preferentially the nominal focal point of the high power laser beam 2 having a certain focal depth 80. The position of the droplet target 4b will be changed on a predefined number of points composing a spatial trace. Two possible spatial traces 82 and 82b are shown in FIG. 8. The spatial trace can be programmed with a controller unit 24 sending the command to the motor controller 17b to move on the predefined trace. The radiation signal will be constantly recorded on each of the predefined points composing the spatial trace 82 or 82b. The scanned area will be larger than the main laser beam focal depth 80. The unit 24 will compare the different radiation signals and find the maximum value of radiation emission, which in turn will define the set position for the feedback system. In this way an automatic optimization of the droplet position with respect to the laser focus position can be obtained. The radiation scan function can be also activated during source operation: Since the radiation sensor has a high precision in the determination of the focus, especially in the case of an EUV radiation sensor, position, if during source operation the signal decreases, it means that an instabilities in the droplet target has occurred. In this case the scan function can be activated in order to further adjust the droplet target position in a so-called fine tuning spatial regime that is not reachable with the only use of the photodiodes arrays. It is clear that the scan function will need a certain time to redefine the focus position. It is hence preferable to activate the scan function not frequently in during source operation. Otherwise the high response time of the tracking system will be compromised.

The control unit 20 can be also programmed for an online calibration changing the photodiodes channels coordinates to a different set of coordinates, as for example, Cartesian coordinates. A controller unit 24 can be programmed so that the motors 17 move on a defined linear spatial trace along a predefined number of channels on both spatial axes, so that for example, a channel/micrometer calibration can be obtained.

The overall controller is further implemented with a graphical interface unit 25 allowing the user to graphically detect and track the droplets of the droplet target. The unit 25 can be implemented so that the target position is graphically plotted, for example in the 2D Cartesian coordinates and in the single horizontal axes versus time. The unit 25 will allow the user to steer the droplet target dispenser 4 to a desired position, to automatic or manually keep the droplet target 4b in a desired position, to monitor the EUV signal, to monitor the droplet velocity etc.

The response time of the controller will depend from the response time of the different components composing the tracking system. It mainly will depend on the read out time of photodiodes sensors and on the movement of the motors. Processing of the signals can be optimized with the use of a real time controller, as for example, Field Programmable Gate Array (FPGA) integrated circuit. The read out time of the sensors and processing of the data can in this way be reduced on a time scale on the order of microseconds. The sampling rate of the sensors should always be higher of, at least, two times the frequency of the piezo modulator. If these two frequencies are not matched properly, the droplet target could cross the laser line when the sensors 16 or 19 are not ready to read out a subsequent signal. This would decrease the number of acquired signals in a certain interval of time for the calculation of the moving variance and the spatial resolution of the tracking system could be comprised. The time that the motors need to do a certain distance at least one of magnitude higher than the time needed to process the data. The overall response time of the system will be on a time scale on the order of milliseconds. The spatial resolution will be on the order of less than one micrometer. The combination of the photodiode arrays 16, 19 with a limited number of channels with the use of the two magnification lenses 13, 15 is important for this invention. High sampling rate and high spatial resolution can be achieved at the same time.

Figure 9:
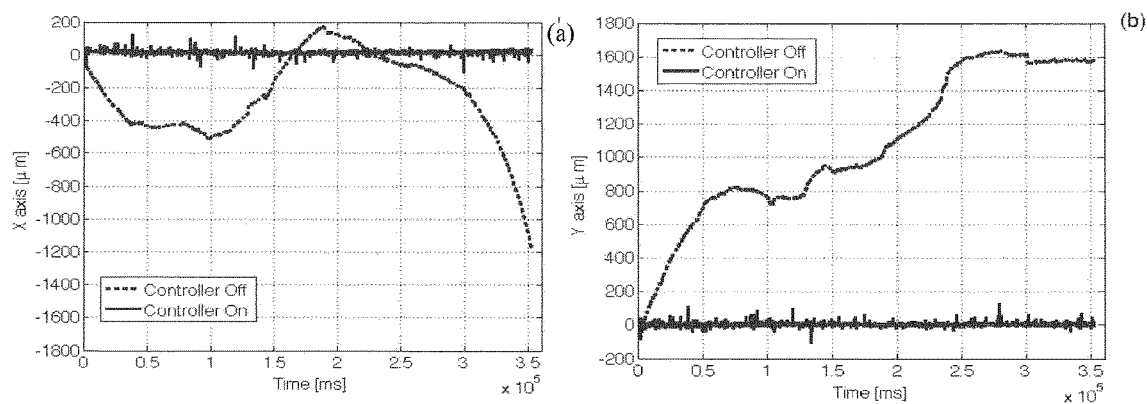
FIG. 9 shows experimental data that can be obtained with the system of the present invention.

In FIG. 9, examples of real experimental data that can be obtained with the tracking system in the horizontal plane are shown. The corrected droplet target trace is reported together with the motor trace versus time. The motor trace represents the specular movement of the droplet target if the closed loop positioning system would be turned off. The corrected droplet target trace is shown for both spatial horizontal axes x and y, respectively in FIG. 9(a) and in FIG. 9(b). With the use of the automated control system, the standard deviation on the droplet position is reduced from $\sigma=260.85$ μm (controller off) to $\sigma=6.86$ μm (controller on) for the x axis and from $\sigma=438.02$ μm (controller off) to $\sigma=6.70$ μm (controller on) for the y axis. In this particular case, signal processing is obtained through a real time control unit, which realizes simultaneous Data Acquisition (DAQ), i.e. the photodiode signals are read out in parallelized mode.

Figure 10:
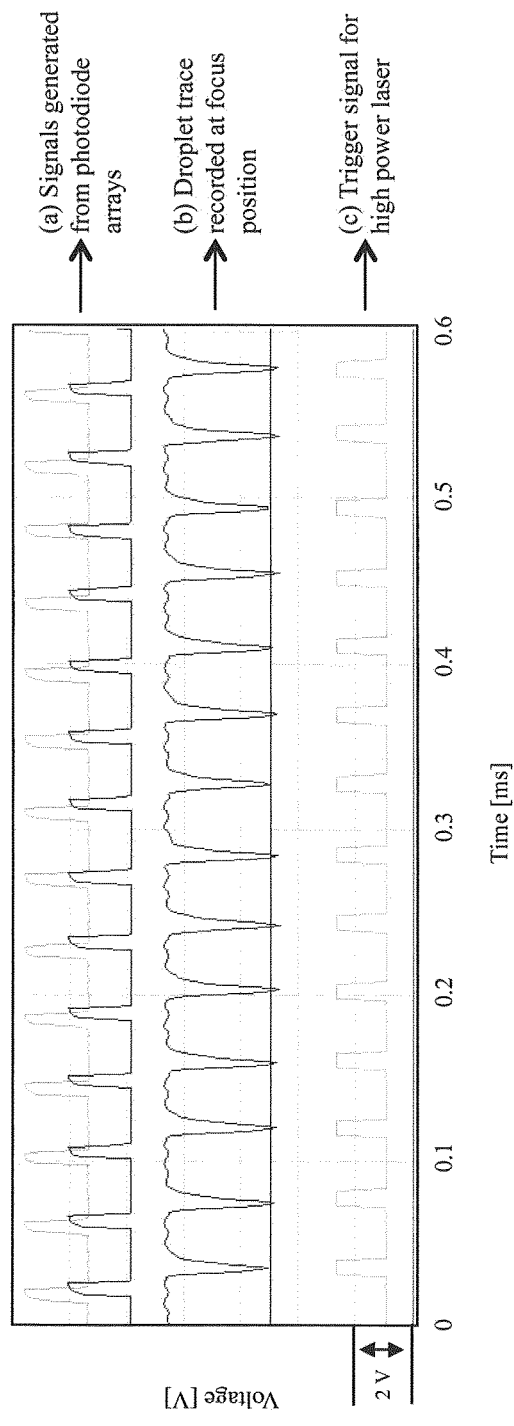
FIG. 10 shows further experimental data that can be obtained with the system of the present invention.

In FIG. 10, examples of real experimental data that can be obtained in the vertical plane are shown. By recording the droplet traces with the single photodiodes composing the two photodiodes arrays read out in parallelized mode, two squared signals are generated (a). On the focus position the droplet trace is recorded (b). By combining in time the signals generated from the photodiode arrays, the triggering signal (c) for the high power laser can be generated. In this particular case the pulse train (a) is fed into a fast FPGA-Card, which calculates time delay generates trigger signal (c). As it can be seen from the figure, the droplet trace (a) is synchronized in time with the triggering signal (c), which means that the droplet velocity and consequently the delay for the high power laser is correctly calculated.

In contrary to previous steering systems, the present invention proposes the use of only two photosensitive sensors and two light sources. It will be understood that the set-up of the different optics can be differently arranged. In the preferred embodiment all tracking equipment (except the radiation sensor 41) is placed outside of the vacuum chamber 50 indicated in FIG. 1. The laser lines illuminate the droplet target placed inside the vacuum chamber, and are sent out from the vacuum chamber with the use of optical vacuum ports. This allows obtaining high flexibility for the alignment between the different tracking components. It also avoids any type of damage of the collection optics and sensors composing the steering system coming from plasma debris or other sources of light.

In summary, the present invention teaches a system to continuously detect, track and eventually adjust the position of the droplet target in any field were spatial and temporal stabilization is needed for the droplet target. In particular, this system can be used to optimize the generation of EUV radiation from an EUV source. The system includes:

The generation of the droplet target with a motorized droplet target dispenser interacting with a high power and high repetition laser generating the plasma.

An EUV radiation sensor or any other sensor able to detect the light emission from the plasma in the EUV wavelength region or other wavelength regions close to the one of EUV emission such as the UV or the Soft X ray range region.

A system of, at least, two laser beams illuminating the droplet target;

A system of, at least, two photodiodes able to constantly collect and record the laser current signal before, during and after the droplets in the droplet target cross the laser beams.

An acquisition and analyzing system that records and processes the current signals of the EUV sensor and the current signals of the two photodiodes during source operation and determines respectively the high power laser focus position, the droplet target position and the droplet target velocity.

A feedback system that compares the actual droplet target position to a predefined set position, and eventually gives an electronically command to the motorized droplet target dispenser that mechanically brings back the droplet target to the set position if a lateral instabilities occurs, i.e. if a spatial deviation from the set position has occurred.

A feedback system that calculates from the actual droplet target velocity, the time when the droplet will be hit by the high power laser and eventually delays in time the high power laser pulse if the droplet target velocity changes, i.e. if the spacing between two droplets in the droplet target changes.

Especially, two laser beams illuminate the droplet target from two different directions on the horizontal plane and at two different heights on the vertical plane.

The two laser beams are preferentially orthogonal to each other in the horizontal plane and at a different distance in the vertical plane.

Furthermore, the system of the two laser beams illuminating the droplet target further comprise different optics, that are magnifying optics, such as a telescope system or a beam expander placed in front each laser beam to magnify the beam, allowing to monitor the droplet target position in a large spatial area.

Furthermore, two cylindrical lenses are placed in front of the magnifying optics that focus the laser beam only on the vertical axis at the droplet target position in order to obtain two horizontal laser lines allowing to illuminate and monitor a large area around the droplet target position.

Furthermore, two beam splitters are aligned to the two laser lines, after they have illuminated the droplet target, each one splitting one laser line into two laser lines, so that four laser lines in total are obtained.

Furthermore, the system may have four laser lines, whereby two laser lines are sent to two multiple channels photodiode sensors for the determination of the droplet position in the spatial domain, and two laser lines are sent to two single channel photodiode sensors for the determination of the droplet position in the temporal domain.

Furthermore, four spectral filters may be placed in front of each sensor so that only the light emission of predefined wavelength of the two laser lines is recorded, avoiding to collect radiation of different wavelengths coming from other sources of light.

Specifically, the two multiple channel photodiode sensors may be two photodiode arrays with a limited number of photodiodes in order to obtain a fast reading out time of the sensors signals.

Furthermore, the two laser lines illuminating to the two photodiode arrays may have two magnification lenses placed before each sensor that further expands the laser line.

The limited number of photodiodes in the photodiode array and the additional magnification optics assure fast reading out time of the sensor signals and high precision in the determination of the droplet spatial position.

The two single channel photodiodes provide a reading out time of the sensor signals that is, at least, higher than the frequency of the droplet train, in order to record the signal of each droplet composing the droplet target.

Furthermore, two diaphragms or two focusing lenses are placed before each sensor.

The recording and analyzing system records and stores the current signals of the photodiodes and of the plasma radiation sensor in the EUV wavelength region or others during source operation, analyzes the variation of the current signals once the droplet target crosses the laser lines, determines, from the analysis of the current signals of the two photodiode arrays, the droplet target spatial position, determines, from the analysis of the current signals of the single channel photodiodes sensors, the droplet target velocity, and repeats the storing and the analysis steps a predetermined number of times in order to determine the droplet target position with high precision.

The determination of the droplet position further comprises the steps of analyzing the diffraction pattern created by the droplet target crossing the laser line, rotating the photodiode array of a certain angle in the vertical axes in order to limit the effect of the diffraction pattern on the sensor signal, and determining the position of the droplet target with a cross-correlation method.

The active feedback system is a close loop control system with a controller having a memory for executing instructions to electrically control an operation of the system with a high temporal resolution.

The system further comprises a motorized translational and rotational system for receiving a set of commands and moving the droplet target according to the set of commands.

Further steps are: changing the photodiode channel coordinates of the droplet target in a set of different coordinates, as for example Cartesian coordinates, with a channel-micrometer calibration, providing a first executable set of instructions for determining the actual droplet target spatial coordinates and the actual droplet target velocity, providing a second executable set of instructions for comparing the actual droplet target spatial coordinates to a predetermined set position, providing a third executable set of instructions for generating the set of commands to trigger the high power laser frequency with the droplet train frequency in order to hit each droplet composing the droplet target with the high power laser, providing a fourth executable set of instructions for generating the set of commands for correcting the generated droplet target spatial position, if it is not at the set position, i.e. if a lateral instability occurs, and providing a fifth executable set of instructions for generating the set of commands for correcting the high power laser frequency, if the spacing between two droplet changes, i.e. if an axial instability occurs in order to avoid droplet/laser pulse desynchronization.

Especially, only the two photodiode arrays could be used to detect, track and correct the droplet target position in both spatial and temporal domain if each signal of each photodiode composing the photodiode array is read out in parallelized mode, so that one of photodiode composing the array will be able to read out also the droplet signal as the single channel photodiode does.

Furthermore, the motorized translation system may be moved according to a set of commands along a predefined spatial trace and acquire along this trace for a predefined number of positions the plasma radiation signals, preferably in the EUV radiation wavelength region, the EUV signals may be recorded and processed, and the different EUV signals may be combined to find the maximum value of sudden signals, which means to find the main laser focus position.

Furthermore, the main laser focus position may be set as the set position for the feedback system, and an executable set of instructions may be provided executing the set of commands for automatic optimization of the droplet position by bringing back the droplet target position to the focus position if a lateral instability has occurred.

Lateral instabilities can be further corrected in a so-called fine tuning spatial regime that means in a range of spatial resolution of less than one micrometer.

Finally, a graphical interface allows the user to detect and track the droplet position in the in the horizontal space, with respect to the focus position, detect and track the droplet separately on each horizontal axis versus time, steer the droplet target dispenser to a desired position, automatic or manually keep the droplet target in a desired position, monitor the EUV signal or any other plasma radiation signal emitted in a wavelength region close to the EUV emission region, and monitor the droplet velocity.

What we claim is:

1. A method for controlling an interaction between a droplet target and a high power and high-repetition-rate laser beam at a laser focus position of said laser beam, comprising:
   a. providing a droplet generator for generating a train of droplets as the droplet target with a predetermined droplet frequency and velocity in a predetermined direction;
   b. providing a high power, high-repetition-rate laser for emitting a pulsed laser beam, which is focused in said laser focus position;
   c. aligning said droplet generator such that said train of droplets of said droplet target runs through said laser focus position;
   d. generating the train of droplets as the droplet target; and
   e. emitting the pulsed laser beam in synchronization with said train of droplets of said droplet target, such that said droplet target interacts with said pulsed laser beam at said laser focus position; whereby
   f. an actual position of individual droplets of said droplet target is measured in a plane crossing a direction of said droplet target;
   g. a velocity of individual droplets of said droplet target is measured;
   wherein
   h. said actual position and said velocity of individual droplets of said droplet target are measured optically;
   i. the train of droplets is illuminated on its way from the droplet generator to the laser focus position by at least two fixed laser beams crossing the droplet target in the form of laser lines extending perpendicular to a beam direction and the direction of said droplet target, and the position of said train of droplets of said droplet target within said laser lines is determined by position sensitive photo detection means which are illuminated by said laser beams after having crossed said droplet target;
   j. the droplet generator is realigned in a feedback mode, when the measured actual position of said individual droplets deviates from a predefined set position; and
   k. a timing of pulses of the pulsed laser beam is changed in the feedback mode, when the measured velocity of said individual droplets leads to an arrival time of the respective droplets at said laser focus position, which is out of synchronization with the pulsed laser beam,
   wherein said at least two laser beams illuminate said droplet target from two different directions in a plane perpendicular to the droplet target and at two different heights with respect to the direction of said droplet target,
   wherein the time delay ($t_1$) is measured between the subsequent illuminations of an individual droplet of said droplet target by said at least two laser beams, and the velocity of said individual droplet is determined from said measured time delay ($t_1$) and a distance ($d_1$) between said at least two laser beams in the direction of the droplet target, and
   wherein said at least two laser beams are each split into a first and second beam after having crossed said droplet target, and wherein said subsequent illuminations of an individual droplet of droplet target by said at least two laser beams are sensed by separate single channel photodiodes each receiving a second of said split beams.

2. The method according to claim 1, wherein the droplet generator is realigned by moving said droplet generator in a plane crossing the direction of the droplet target and/or tilting said droplet generator.

3. The method according to claim 1, wherein the interaction between the droplet target and the pulsed laser beam generates EUV radiation, the EUV radiation is sensed by a radiation sensor, and the signal of the radiation sensor is used to determine the laser focus position.

4. The method according to claim 1, wherein the position and velocity measuring steps (f) and (g) are repeated a predetermined number of times and results stored in order to determine the droplet target position with enhanced precision.

5. An apparatus for controlling an interaction between a droplet target and a high power and high-repetition-rate laser beam at a laser focus position of said laser beam, comprising:
- a movable droplet generator, which ejects a train of droplets as the droplet target in a predetermined direction;
- a controllable high-repetition-rate, high power laser, which emits a pulsed laser beam being focused in the laser focus position lying on a way of said train of droplets;
- a first continuous laser source emitting a first continuous laser beam in a first plane crossing the droplet target in a first direction;
- a second continuous laser source emitting a second continuous laser beam in a second plane crossing the droplet target in a second direction;
- first means for expanding said first continuous laser beam into a first laser line extending perpendicular to the droplet target and crossing said droplet target;
- second means for expanding said second continuous laser beam into a second laser line extending perpendicular to the droplet target and crossing said droplet target;
- first photodetection means for receiving said first laser line after having crossed said droplet target;
- second photodetection means for receiving said second laser line after having crossed said droplet target; and
- a control unit, which receives signals from said first and second photodetection means and controls the movement of said droplet generator and a timing of the laser pulses of said high-repetition-rate, high power laser,
wherein first and second beam splitting means are provided in said first and second laser lines behind said laser focus position in order to generate a first and second split beam, and third and fourth photodetection means are provided to receive said first and second split beams and send respective signals to said control unit.

6. The apparatus according to claim 5, wherein said first and second plane are separated in a direction of said droplet target by a first distance ($d_1$).

7. The apparatus according to claim 5, wherein said first and second directions are orthogonal to each other.

8. The apparatus according to claim 5, wherein said first and second expanding means each comprise a beam expander and a cylindrical lens.

9. The apparatus according to claim 5, wherein said first and second photodetection means are each a multichannel photodiode sensor or linear photodiode array.

10. The apparatus according to claim 9, wherein a magnifying lens is arranged before each of said multichannel photodiode sensors or linear photodiode arrays.

11. The apparatus according to claim 9, wherein a bandpass optical or spectral filter is arranged at the entrance of each of said multichannel photodiode sensors or linear photodiode arrays.

12. The apparatus according to claim 5, wherein said third and fourth photodetection means are each single channel photodiodes.

13. The apparatus according to claim 5, wherein a radiation sensor is provided to receive EUV radiation generated at said laser focus position and send respective signals to said control unit.

14. The apparatus according to claim 5, wherein said movable droplet generator is mechanically coupled to a motor, which is controlled through said control unit by means of a motor controller.

* * * * *